(12) United States Patent
Bauer et al.

(10) Patent No.: US 10,598,746 B2
(45) Date of Patent: Mar. 24, 2020

(54) MAGNETIC RESONANCE METHOD AND APPARATUS WITH REDUCTION OF ARTIFACTS BY A COMBINATION OF SPAIR PULSE AND SATURATION PULSE

(71) Applicant: Siemens Healthcare GmbH, Erlangen (DE)

(72) Inventors: Simon Bauer, Baunach (DE); Ralf Kartaeusch, Erlangen (DE); Joerg Roland, Hemhofen (DE)

(73) Assignee: Siemens Healthcare GmbH, Erlangen (DE)

(*) Notice: Subject to any disclaimer, the term of this patent is extended or adjusted under 35 U.S.C. 154(b) by 131 days.

(21) Appl. No.: 15/972,766

(22) Filed: May 7, 2018

(65) Prior Publication Data

US 2018/0321346 A1 Nov. 8, 2018

(30) Foreign Application Priority Data

May 8, 2017 (DE) .................. 10 2017 207 687

(51) Int. Cl.
*G01R 33/48* (2006.01)
*G01R 33/483* (2006.01)
(Continued)

(52) U.S. Cl.
CPC ..... *G01R 33/4828* (2013.01); *G01R 33/4838* (2013.01); *G01R 33/5607* (2013.01);
(Continued)

(58) Field of Classification Search
CPC ............ G01R 33/4838; G01R 33/5607; G01R 33/4824
See application file for complete search history.

(56) References Cited

U.S. PATENT DOCUMENTS

2004/0257077 A1 12/2004 Bottcher et al.
2011/0096974 A1* 4/2011 Gilson ............... G01R 33/4828
382/131
(Continued)

FOREIGN PATENT DOCUMENTS

DE 10314407 A1 11/2004
DE 102014204996 A1 9/2015

OTHER PUBLICATIONS

German Office Action for 10 2017 207 687.9 dated Feb. 15, 2018 (English-language translation attached).
(Continued)

*Primary Examiner* — Alvaro E Fortich
(74) *Attorney, Agent, or Firm* — Schiff Hardin LLP (57) ABSTRACT

For reduction of artifacts when acquiring magnetic resonance (MR) data using an MR apparatus, a SPAR pulse, which acts on spins in a first predetermined frequency range, and a saturation pulse, which acts on spins in a second predetermined frequency range, are radiated. A gradient for spatial encoding is activated at the same time as the saturation pulse, so that the saturation pulse acts on an edge region adjacent to the volume segment. The edge region borders an ellipsoidal useful volume of the scanner of the MR apparatus, in which the strength of the B0 field changes in terms of magnitude by no more than 30 ppm. Spoiler gradients are activated to destroy a transverse magnetization, before an RF excitation pulse, adjusted to the SPAIR pulse, is radiated. MR data are acquired after the SPAIR pulse, the saturation pulse and the RF excitation pulse. The second frequency range is adjusted to the first frequency range.

7 Claims, 4 Drawing Sheets

(51) Int. Cl.
    *G01R 33/56* (2006.01)
    *G01R 33/28* (2006.01)
    *G01R 33/565* (2006.01)

(52) U.S. Cl.
    CPC ........ *G01R 33/288* (2013.01); *G01R 33/4824* (2013.01); *G01R 33/56563* (2013.01)

(56) References Cited

U.S. PATENT DOCUMENTS

| | | | |
|---|---|---|---|
| 2012/0119740 A1* | 5/2012 | Takahashi | A61B 5/055 324/309 |
| 2012/0194193 A1* | 8/2012 | Rehwald | G01R 33/4828 324/318 |
| 2015/0268318 A1 | 9/2015 | Blumhagen et al. | |

OTHER PUBLICATIONS

German Decision to Grant for 10 2017 207 687.9 dated Mar. 18, 2019 (English-language translation attached).

* cited by examiner

MAGNETIC RESONANCE METHOD AND APPARATUS WITH REDUCTION OF ARTIFACTS BY A COMBINATION OF SPAIR PULSE AND SATURATION PULSE

BACKGROUND OF THE INVENTION

Field of the Invention

The present invention concerns a method and a magnetic resonance (MR) apparatus wherein artifacts are reduced when acquiring MR data of a volume segment of an examination object, by a SPAR pulse being combined with a local or localized saturation pulse.

Description of the Prior Art

In magnetic resonance tomography, various saturation methods are used in order to suppress an MR signal from particular substances or from particular spatial regions. Most of these saturation methods have problems in the edge regions of the ellipsoidal useful volume of the magnetic resonance scanner, which typically has a lower extent in the z direction. While the magnetic field generated by the magnetic resonance scanner in the ellipsoidal useful volume (the B0 field) is very homogeneous, the change in strength of this magnetic field in the edge regions or boundary regions directly adjoining the ellipsoidal useful volume varies to a very significant degree.

Figure 5:
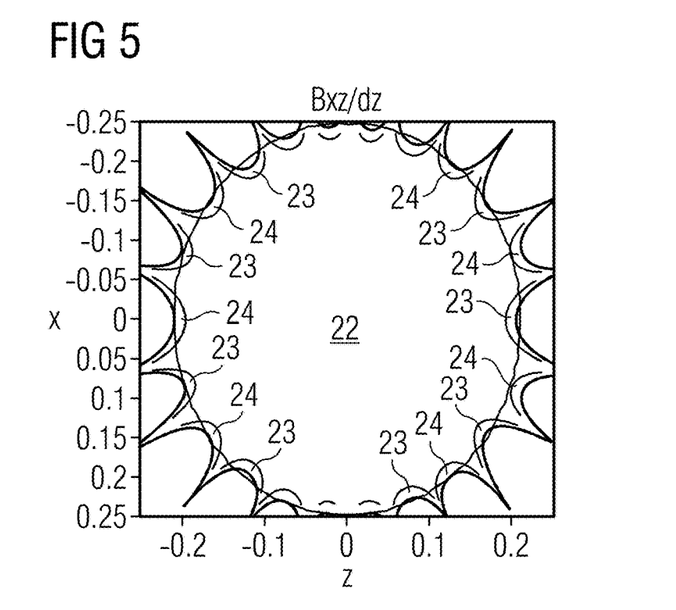
FIG. 5 schematically shows the change in strength of the B0 field in the useful volume (central imaging region) and in the boundary regions.

As shown in the example of FIG. 5, in the edge regions of the ellipsoidal useful volume 22, which may also be referred to as the imaging volume, rosette-like structures with strong field gradients are typically formed. Here, the sign of the magnetic field change switches from rosette to rosette, or from sheet 23, 24 to sheet 24, 23. A simple adjustment of the saturation method to the switching magnetic field circumstances in the edge regions is not readily possible.

If radial MR sequences are used in examinations in the torso region (lungs, heart, abdomen, intestines, female and male pelvis) in particular, MR signals from the edge regions lead to artifacts which make diagnosis markedly more difficult. The disruptive MR signals frequently originate from the edge regions of the arms of the patient, which may then lead to the described artifacts (so-called "streakings"). In the context of image reconstruction techniques, such as compressed sensing, which implement iterative methods and work with a significant underscanning, the artifacts arise to an even more significant degree.

SUMMARY OF THE INVENTION

An object of the present invention is to reduce the artifacts originating from the MR signals from the edge region more effectively than was previously possible according to the prior art.

This object is achieved by a method according to the present invention for the reduction of artifacts when acquiring MR data of a volume segment of an examination object using a magnetic resonance apparatus. The inventive method has the following steps. The steps described below are implemented by generating control signals in a computer of an MR apparatus corresponding to the data acquisition sequence described below, and those control signals are emitted from the computer to an MR data acquisition scanner of the MR apparatus.

A SPAR ("Spectrally Adiabatic Inversion Recovery") pulse is radiated, which acts on spins in a first predetermined frequency range.

A spatial saturation pulse is radiated after the SPAR pulse, which acts on spins in a second predetermined frequency range. Here, a gradient for spatial encoding is loaded at the same time as the saturation pulse, so that the saturation pulse acts on spins in an edge region adjacent to the volume segment in order to substantially saturate or suppress an MR signal from said edge region. The edge region borders an ellipsoidal useful volume of the magnetic resonance system, in which a homogeneous B0 field prevails, the strength of which changes in terms of magnitude by no more than 20-30 ppm.

Spoiler gradients are activated, in order to destroy transverse magnetization. Using the spoiler gradients, which are activated after the saturation pulse, remaining transverse magnetization is suppressed once more. It is, however, also possible to activate one or more spoiler gradients after the SPAIR pulse in addition to the SPAIR pulse, in order to destroy a transverse magnetization relative to the first frequency range once more.

An RF excitation pulse is radiated adjusted to the SPAIR pulse. The time at which the RF excitation pulse is radiated depends on the time at which the SPAIR pulse is radiated. The inversion time (time interval between the time of the radiation of the SPAIR pulse and the time of the radiation of the RF excitation pulse) is set such that the longitudinal magnetization of the spins, on which the SPAIR pulse acts, is zero when the RF excitation pulse is radiated.

MR data are acquired after the SPAIR pulse, the saturation pulse and the RF excitation pulse.

The acquired MR data are entered into a memory as raw data (k-space data) and the data stored in that memory are made available, via the computer, in electronic form as a data file for archiving and/or reconstructing an MR image therefrom. The reconstructed MR image exhibits reduced image artifacts originating from the MR signals at the edge region, compared to an image reconstructed from MR data acquired without executing the inventive data acquisition sequence.

According to the invention, the second frequency range is adjusted to the first frequency range. By adjusting the second frequency range to the first frequency range, in particular the frequency range which covers both the first and the second frequency ranges together is set to be as large as possible.

By combining SPAIR pulse and saturation pulse or saturation band in one measurement, MR signals from the edge region can also then be almost completely suppressed, if the magnetic field gradients in the edge region have different signs. This means that it is possible according to the invention to eliminate the disruptive MR signals from the edge region almost completely, so that the MR signals from the edge region no longer have a negative influence on the MR imaging of the volume segment.

In this case, the edge region adjacent to the useful volume, which edge region is located as close as possible to the volume segment from which the MR data is to be acquired and in which the field typically experiences first more significant changes (gradients) compared to the central imaging field, is chosen as the edge region.

The first predetermined frequency range substantially corresponds to the frequency range of the fat signal.

By adjusting the SPAIR pulse to the fat signal, it is also advantageously possible for a majority of the fat signals for a sign of gradients (i.e. one half of the rosettes 23 or 24 (FIG. 5) also to be suppressed in the edge region. Advantageously, the second predetermined frequency range can then be chosen such that the saturation pulse eliminates the MR signals not eliminated by the SPAIR pulse in the chosen edge region. Here, the adjustment of the first frequency range is effected by a corresponding frequency and bandwidth adjustment of the SPAIR pulse.

The first predetermined frequency range extends, as a function of inhomogeneities of the B0 field in the edge region, from a lower boundary of the frequency range of the fat signal to a frequency at which an amplitude of the fat signal has a predetermined ratio (e.g. 1) to an amplitude of the water signal. For example, at this frequency the amplitude of the fat signal can be lower than the amplitude of the water signal from the central imaging regions (useful volume).

Due to the inhomogeneities of the magnetic field, the course of the fat signal, which is pulse-shaped with a homogeneous magnetic field, broadens over the frequency, so that the frequency range of the fat signal increases both downward and upward (i.e. to lower and higher frequencies) compared to the pulse-shaped course of the fat signal with a homogeneous magnetic field. This means that the frequency range of the fat signal in the edge region also extends into the frequency range of the broadened water signal. According to this embodiment, the SPAR pulse is now set or adjusted such that the first predetermined frequency range extends from the lower boundary of the frequency range of the fat signal to the frequency at which the amplitude of the fat signal is lower than the amplitude of the water signal, as has been described above. This means that the fat signal in the edge region is completely suppressed at least for those regions in which the change in strength of the magnetic field has a negative sign due to the inhomogeneity. The saturation band caused by the saturation pulse can then be set such that in the edge region the water signal is suppressed by the saturation pulse in those regions in which the change in strength of the magnetic field has a positive signal due to the inhomogeneity.

Therefore, the second predetermined frequency range lies above the first predetermined frequency range.

While the fat signal is entirely eliminated (in the volume segment and in the edge region) with the aid of the SPAIR pulse (with the limitations described above), the water signal is substantially suppressed in the edge region using the saturation pulse. Since the frequency of the fat signal lies below the frequency of the water signal, the second predetermined frequency range advantageously lies above the first predetermined frequency range.

According to the invention, the variants for the location of the first and the second predetermined frequency range are:

The first and the second predetermined frequency range may overlap. In this situation, signals from the overlap region, in which the first and the second frequency range overlap, are effectively suppressed twice (by the SPAIR pulse and spatial saturation pulse).

The second frequency range lies with a particular spacing above the first frequency range.

The second frequency range borders said first frequency range above the first frequency range.

In order to achieve the variant most recently described, the saturation pulse is chosen together with the simultaneously radiated gradient such that the second predetermined frequency range resulting therefrom follows on above the first predetermined frequency range. According to this variant, the upper boundary of the first frequency range corresponds to the lower boundary of the second frequency range, so that there are substantially no gaps between the first and the second frequency range.

In all three variants, MR signals from the edge region in particular are suppressed by the radiation of the SPAIR pulse, the radiation of the saturation pulse and the activation of the spoiler gradients.

The combination of SPAIR pulse and saturation pulse advantageously enables a considerable reduction of the remaining signal from the edge region (the outer regions) for a further spatial region and thus the avoidance of streakings over the entire imaging region.

The combination of SPAIR pulse and saturation pulse according to the invention is particularly suitable in combination with an MR data acquisition using a radial MR sequence, since MR images generated by radial MR sequences are more significantly disturbed by MR signals from the edge region than MR images generated by Cartesian MR sequences, for example.

The present invention also encompasses a magnetic resonance apparatus having an MR scanner in which the B0 field is generated, an RF antenna operated by an RF controller, a gradient coil arrangement operated by a gradient controller, and an image sequence controller, which are designed or programmed to collectively operate the MR scanner so as to acquire MR data of a volume segment of an examination object and to reduce artifacts in the process. The RF controller operates the RF antenna to radiate a SPAIR pulse, which acts on spins in a first predetermined frequency range, and to radiate a saturation pulse, which acts on spins in a second predetermined frequency range. The gradient controller activates a gradient for spatial encoding at the same time as the saturation pulse, so that the saturation pulse acts on an edge region adjacent to the volume segment in order to substantially saturate MR signals from this edge region. The edge region borders an ellipsoidal useful volume of the magnetic resonance scanner, in which a homogeneous B0 field prevails, the strength of which changes in terms of magnitude by no more than 20-30 ppm. In addition, the gradient controller is configured to activate spoiler gradients in order to destroy a transverse magnetization. Via the RF controller and the image sequence controller, the magnetic radiated RF excitation pulse is adjusted to the SPAIR pulse, and MR data are acquired after the SPAIR pulse, the saturation pulse and the RF excitation pulse. According to the invention, the second frequency range is adjusted to the first frequency range.

The advantages of the magnetic resonance apparatus according to the invention correspond substantially to the advantages of the method according to the invention, as explained above in detail.

The present invention also encompasses a non-transitory, computer-readable data storage medium encoded with programming instructions (code) that, when the storage medium is loaded into a computer or computer system of an MR apparatus, cause the computer or computer system to operate the MR apparatus in order to implement any or all embodiments of the method according to the invention, as described above.

The code can be a source code (e.g. C++) which must still be compiled (translated) and stored or which must only be interpreted, or can be an executable software code that, for execution, needs only be loaded into the corresponding computer unit or control processor.

The electronically readable data carrier can be a DVD, a magnetic tape, a hard disk or a USB stick, on which electronically readable control information, in particular software code is stored.

According to the invention, the saturation in the edge region is effected by combining a saturation with the SPAR pulse and a saturation with the saturation pulse. Here, the saturation with the SPAR pulse saturates the fat signal in the edge region in particular in regions in which the change in strength of the B0 field has a negative sign, so that only a low-contrast water signal remains for said regions in the edge region.

Streakings from said regions remain present, but are considerably reduced by the suppression of the fat signal.

The saturation band generated by the saturation pulse is first spatially adjusted to the edge region and is additionally adjusted in terms of frequency to the regions in the edge region, in which the change in strength of the B0 field has a positive sign. The additional adjustment in terms of frequency means that the efficiency of the saturation (i.e. signal suppression and duration of the suppression of the MR signals in the edge region) is considerably increased. For example, radiating the saturation pulse is less frequently necessary due to the improved fit. Moreover, the bandwidth of the saturation pulse can be markedly reduced, since the only signals which are saturated are those in the regions of the edge region in which the change in strength of the B0 field has a positive sign.

While an efficient saturation in the edge region using the saturation pulse alone (without SPAR pulse) would lead to a bandwidth of 20 to 30 ppm, this bandwidth may be reduced to 5 ppm for example according to the invention (using a SPAR pulse). Playing the saturation pulse therefore advantageously only leads to a low SAR load for the patient.

In addition, it should be noted that the SAR load in magnetic resonance tomography is a topic with far-reaching consequences. For example, an SAR load that is too high leads to limitations in timing the sequences implemented, so that a waiting time must be observed between individual RF pulses (for cooling) in order to avoid the SAR load from becoming too high. This results in some of the measuring times being considerably extended. In turn, this may lead to imaging in a region such as the abdomen having to be broken down into a larger number of breath-hold measurements, which is stressful for the patient and disadvantageous for efficiency.

In summary, the combination with the saturation by the SPAR pulse enables an efficient implementation of saturation pulses in radial sequences with high requirements in terms of time. This advantageously enables a marked reduction and homogenization of the MR signal from the imaging edge regions (e.g. arms). In turn, this produces a considerable reduction in streaking artifacts, whereby a diagnostic image quality is also enabled for radial MR sequences.

DESCRIPTION OF THE PREFERRED EMBODIMENTS

Figure 1:
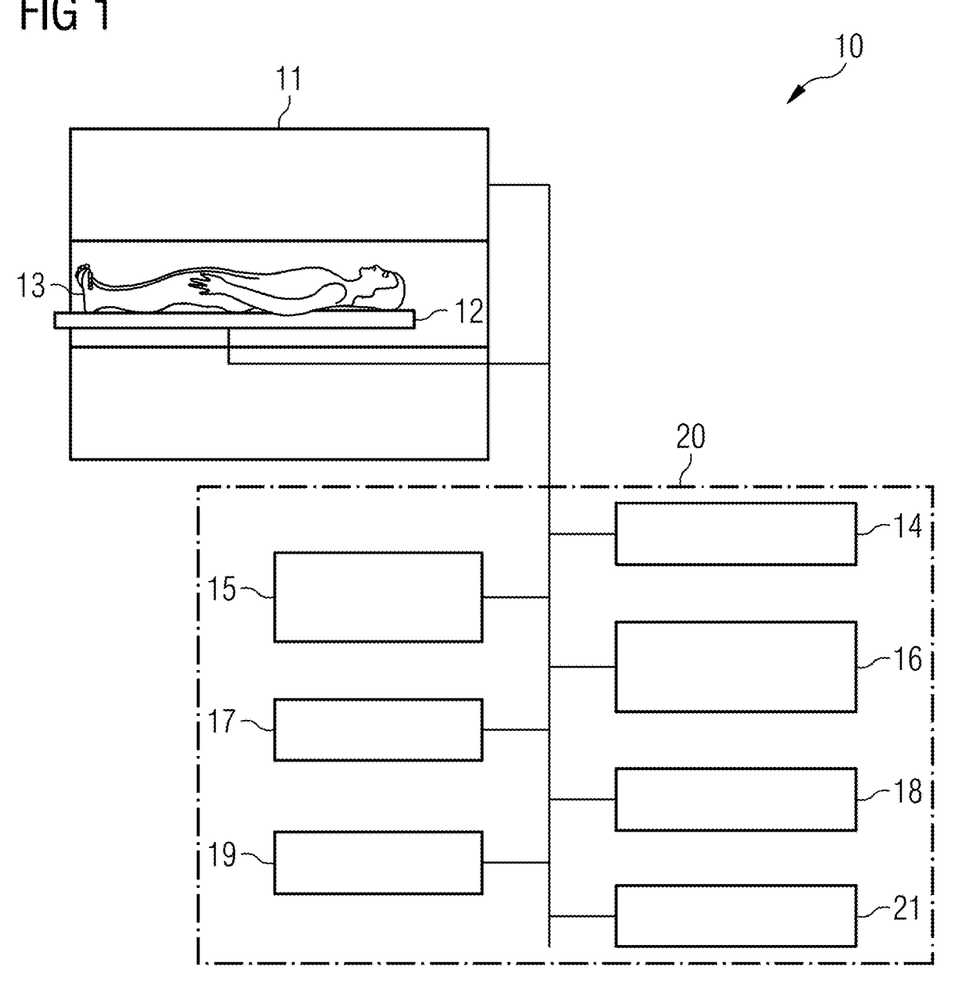
FIG. 1 schematically illustrates a magnetic resonance system according to the invention.

FIG. 1 illustrates an MR apparatus 10 with which, as explained below, MR signals in the edge region of the imaging volume are suppressed by combining a saturation with a SPAR pulse and a saturation with a saturation pulse. The MR apparatus 10 has an MR data acquisition scanner 11 with a magnet that produces a polarization field B0. An examination subject 13 on a support 12 is moved into the scanner 11 in order to record position-encoded magnetic resonance signals or MR data from the examination subject 13. The coils used for signal recording, such as a whole body coil or local coils, are not shown for clarity. By radiating radio-frequency pulses and switching magnetic field gradients, the magnetization of certain nuclear spins in the subject 13 produced by the polarization field B0 is deflected out of the equilibrium position and MR signals are emitted and spatially encoded, and detected by RF reception coils. Those skilled in the field of MRI know how MR images are generated by radiating RF pulses and switching magnetic field gradients in different combinations and sequences, and so this need not be explained in greater detail herein.

The magnetic resonance apparatus 10 further has a control computer 20 that controls the magnetic resonance apparatus 10, in particular the scanner 11. The control computer 20 has a gradient controller 15 for controlling and switching the necessary magnetic field gradients. An RF controller 14 controls and generates the RF pulses for deflecting the magnetization. An image sequence controller 16 controls the sequence of the magnetic field gradients and RF pulses and thus indirectly the gradient controller 15 and the RF controller 14. Via an input unit 17, an operator can control the magnetic resonance apparatus 10 and, on a display unit 18, MR images and other information necessary for the control can be displayed. A processor 19 controls the different components in the control computer 20. Furthermore, a memory 21 is provided in which, for example, program modules or programs can be stored that, when they are executed by the processor 19, control the sequence of the magnetic resonance apparatus 10. The processor 19 is also designed to serve as an image data reconstruction processor to calculate MR image data from the acquired MR signals.

Figure 2:
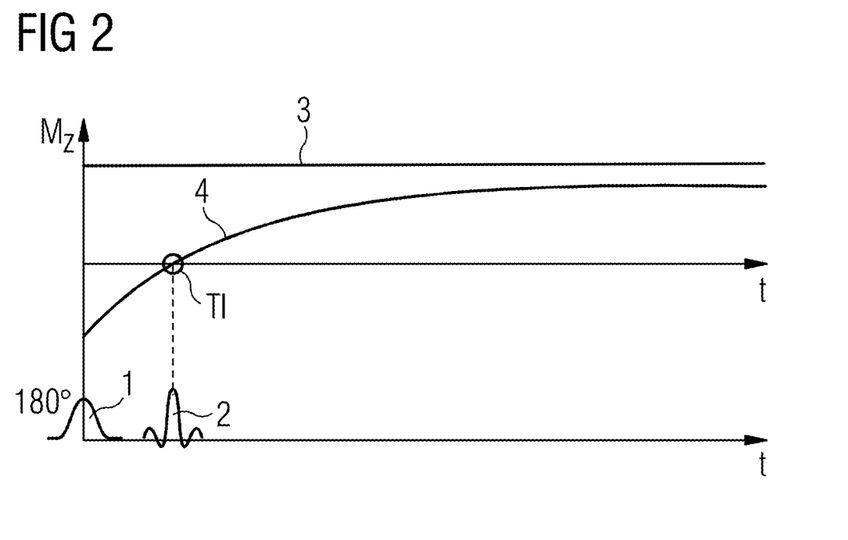
FIG. 2 shows representation of a saturation of the fat signal using the SPAIR pulse.

FIG. 2 describes the inventive effect of the saturation by a SPAR pulse 1.

The SPAR pulse 1 is radiated at time t=0 and tilts the spins by 180° in a first predetermined frequency range, which substantially corresponds to the frequency range of the fat signal 4. At an inversion time TI, at which the longitudinal magnetization of the fat signal is approximately 0, the RF excitation pulse 2 is radiated. The fat spins therefore make almost no contribution to the MR signal which is subsequently acquired during the data acquisition, so that during data acquisition theoretically in effect only MR data of the water signals 3 is acquired. Additionally, spoiler gradients (not shown) can be activated between the SPAIR pulse 1 and the RF excitation pulse 2 in order to destroy the transverse magnetization further.

Figure 3:
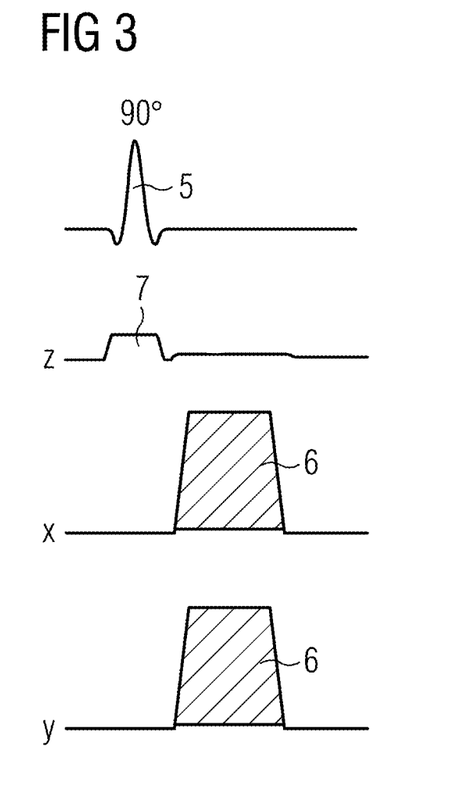
FIG. 3 shows saturation using a saturation pulse.

FIG. 3 describes the inventive effect of the saturation by a SPAIR pulse 5.

The saturation pulse 5 is radiated, while a gradient 7 for spatial encoding is switched at the same time. Substantially only the spins in a particular spatial region (in the edge region in the case of the present invention) are tilted by 90° in the transverse plane by activating the saturation pulse 5 at the same time as the gradient 7. Here, the saturation pulse 5 is generally set so as to generate a maximum phase dispersion relative to the spins tilted by 90°. In order to suppress the transverse magnetization further, after the saturation pulse 5 (and after the gradient 7) spoiler gradients 6 are switched.

Figure 4:
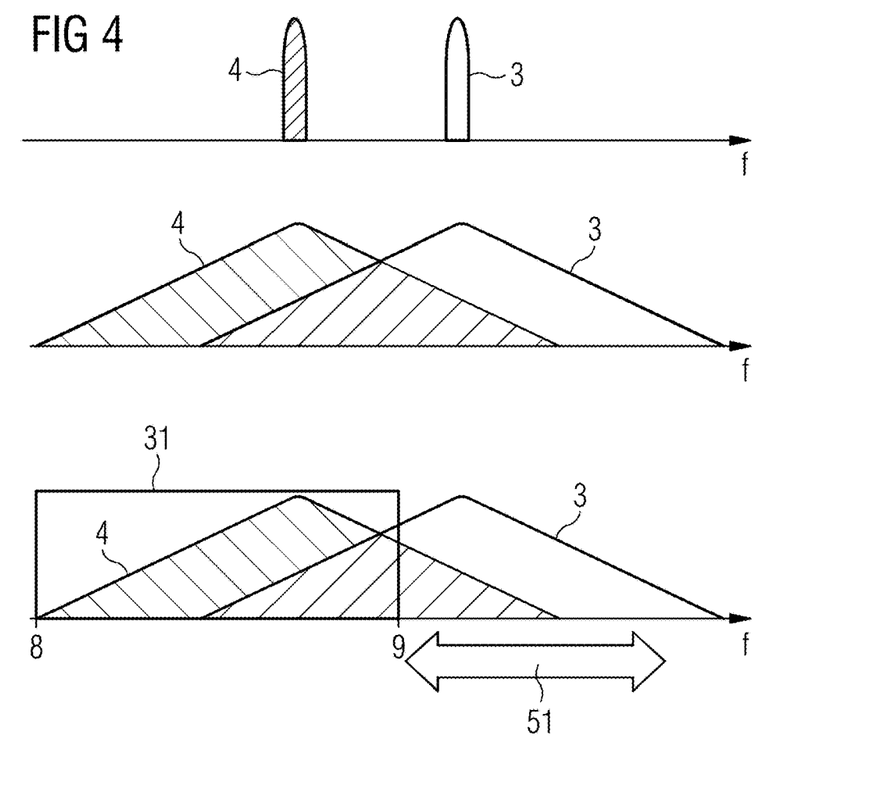
FIG. 4 schematically shows how MR signals are suppressed according to the invention in the edge region by a combination of SPAIR pulse and saturation pulse.

FIG. 4 shows how the first frequency range, on which the SPAR pulse acts, is adjusted to the second frequency range, on which the saturation pulse acts.

With a homogeneous magnetic field, both the frequency range of the water signal 3 and the frequency range of the fat signal 4 are localized in a narrowband manner in the frequency space, as is shown in the upper third of FIG. 4.

As a result of the inhomogeneity of the B0 field outside the ellipsoidal useful volume of the magnetic resonance system, the frequency range of the water signal 3 and the frequency range of the fat signal 4 broaden as shown in the center third of FIG. 4. The frequency range of the water signal 3 and the frequency range of the fat signal 4 are broadband compared to the corresponding frequency ranges in a homogeneous magnetic field (see upper third of FIG. 4). It can be seen that the frequency range of the water signal 3 and the frequency range of the fat signal 4 may even overlap to a significant degree due to the inhomogeneity of the B0 field.

The SPAIR pulse is now adjusted to the inhomogeneities of the B0 field in the edge region, such that the saturation frequency range 31 of the SPAIR pulse extends completely over the lower half of the frequency range of the fat signal 4 and only partially over the upper half of the frequency range of the fat signal 4. In the example shown, the saturation frequency range 31 extends from the lower boundary (frequency 8) of the frequency range of the fat signal 4 up to a frequency 9. Said frequency 9 is chosen in the example shown such that at the frequency 9 the water signal 3 has just become stronger than the fat signal 4.

According to the invention, the saturation by the SPAIR pulse 1 is combined with the saturation by a saturation pulse 5. Here, the saturation pulse 5 and the gradient 7 loaded at the same time are set such that the saturation frequency range 51 of the saturation pulse 5 follows on from the saturation frequency range 31 of the SPAIR pulse 1 directly above said saturation frequency range 31, as is shown in the lower third of FIG. 4. In other words, the saturation pulse 5 and the simultaneously activated gradient 7 are set so that in the corresponding edge region MR signals from the frequency range 51 are saturated. By the interaction between the SPAIR pulse 1 and the saturation pulse 5, MR signals from both the frequency range 31 and the frequency range 51 are suppressed accordingly in the edge region.

The previously described setting of the SPAIR pulse 1, which in particular is effected by a frequency and bandwidth adjustment of the SPAIR pulse 1, the fat signal 4 is reduced in the edge region, at least in regions with a negative sign for the change in magnetic field strength. In theory, it would be possible to set the SPAIR pulse 1 such that it also reduces the fat signal in the edge region in regions with a positive sign for the change in magnetic field strength. Since the fat signal 4, however, significantly overlaps with the water signal 3, the SPAIR pulse 1 would then also suppress a large portion of the water signals in the useful volume or central region of the MR image, as the water frequency in the useful volume corresponds to the fat frequency for the regions in the edge region, in which the change in magnetic field strength has a positive sign.

According to the invention, it would also be possible for the saturation frequency range 51 of the saturation pulse 5 to be embodied more narrowly, so that it would for example be limited to the fat signal 4. This would then be possible, for example, if a residual water signal in the regions of the edge region, in which the change in magnetic field strength is negative, is acceptable for the MR imaging.

FIG. 5 shows the change in strength of the B0 field in the useful volume and in the boundary regions.

While the B0 field is homogeneous in the central region 22, the change in magnetic field strength in the outer region constantly switches the sign. While the rosettes or sheets designated with the reference character 23 have a positive magnetic field change, the sheets designated with the reference character 24 have a magnetic field change (Bxz/dz) with a negative sign. In regions outside the central region 22 and outside the sheets 23, 24, the change in magnetic field strength is markedly negative.

Figure 6:
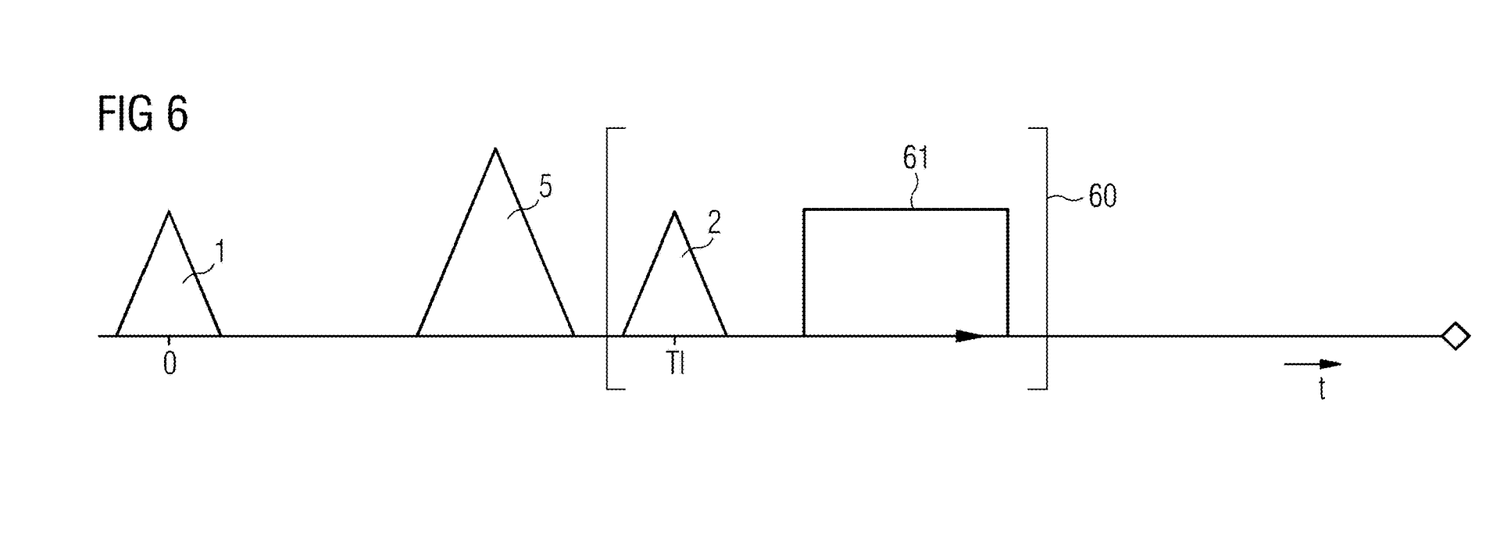
FIG. 6 depicts a sequence diagram according to the invention.

FIG. 6 shows an inventive sequence diagram by way of example.

At time t=0, the SPAR pulse 1 is radiated. Subsequently, the saturation pulse 5 is radiated, while a gradient 7 for spatial encoding (not shown in FIG. 6) is loaded simultaneously. At inversion time TI after the time of the radiation of the SPAR pulse 1, the RF excitation pulse 2 is radiated in order subsequently to acquire MR data in the predetermined volume segment of the examination object as part of the readout 61.

Here, the module 60, which includes the RF excitation pulse 2 and the acquisition of the MR data (readout 61), can be played a number of times before a new SPAR pulse 1 is emitted in combination with a saturation pulse 5 once more.

A typical procedure for determining an inventive sequence diagram and in particular for determining the spatial saturation pulse 5 and the SPAR pulse 1 is described below. The spatial saturator 5 is arranged in the edge region, in particular above the arms of the patient. As the saturation by the spatial saturator 5 alone is not sufficient, the SPAIR pulse 1 is additionally positioned such that the streaking artifacts can be markedly reduced in the case of radial sequences. Depending on the determination of the spatial saturation pulse 5 and the SPAIR pulse 1, the first frequency range 31 and the second frequency range 32 are then produced.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) data acquisition scanner in order to acquire MR data from a volume segment of an examination object, said MR data acquisition scanner having an imaging volume in which a basic magnetic field generated by the MR data acquisition scanner is homogeneous, said examination object being situated in said imaging volume and said imaging volume having an edge region that is adjacent to said volume segment, the basic magnetic field in said edge region differing in magnitude from said basic magnetic field in said imaging volume by no more than 30 parts per million (ppm), said method comprising:

generating control signals in a computer and providing said control signals from said computer to said MR data acquisition scanner in order to operate the MR data acquisition scanner by:
  radiating a Spectrally Adiabatic Inversion Recovery (SPAIR) pulse that acts on nuclear spins in the examination object in a first predetermined frequency range, wherein the first predetermined frequency range is set to correspond to a first frequency range of an MR signal originating from fat and set to extend, dependent on homogeneities in said basic magnetic field, from a lower boundary of the first frequency range of said MR signal originating from fat, to a second frequency range at which a first amplitude of said MR signal originating from fat has a predetermined ratio to a second amplitude of another MR signal originating from water;
  radiating a saturation pulse which acts on nuclear spins in the examination object in a second predetermined frequency range;
  activating a spatially encoding magnetic field gradient at a same time as said saturation pulse, and thereby causing said saturation pulse to act on said edge region in order to saturate an MR signal produced by nuclear spins in the examination object originating from said edge region;
  activating spoiler gradient fields that destroy a transverse magnetization of said nuclear spins at said edge region; and
  radiating a radio frequency (RF) excitation pulse that is adjusted to the SPAIR pulse;
  acquiring MR data from said examination object after radiating said SPAIR pulse, said saturation pulse and said RF excitation pulse, with the second predetermined frequency range adjusted to the first predetermined frequency range; and
  entering the acquired MR data into a memory and making the MR data in said memory accessible, via said computer, in electronic form as a data file.

2. A method as claimed in claim 1 comprising providing said MR data from said memory to an image reconstruction processor and, in said image reconstruction processor, reconstructing image data from said MR data and displaying said image data as an image of said volume segment that exhibits image artifacts in said edge region that are reduced compared to another image of the examination object produced without using said control signals.

3. A method as claimed in claim 1 comprising setting said second predetermined frequency range to be above said first predetermined frequency range.

4. A method as claimed in claim 1 comprising setting said second predetermined frequency range to immediately follow above said first predetermined frequency range.

5. A method as claimed in claim 1 comprising entering said MR data into said memory along a radial trajectory during acquisition of said MR data.

6. A magnetic resonance (MR) apparatus comprising:
  an MR data acquisition scanner that generates a basic magnetic field having a field homogeneity in an imaging volume of the MR data acquisition scanner, said imaging volume having an edge region in which a magnitude of said basic magnetic field differs by no more than 30 parts per million (ppm) from another magnitude of said basic magnetic field in said imaging volume; and
  a computer that generates control signals and provides said control signals to said MR data acquisition scanner in order to operate the MR data acquisition scanner so as to acquire MR data from a volume segment of an examination object situated in said imaging volume, with said edge region being adjacent to said volume segment, wherein the computer is configured to:
  generate said control signals and to operate the MR data acquisition scanner by radiating a Spectrally Adiabatic Inversion Recovery (SPAIR) pulse that acts on nuclear spins in the examination object in a first predetermined frequency range, radiating a saturation pulse which acts on nuclear spins in the examination object in a second predetermined frequency range, activating a spatially encoding magnetic field gradient at a same time as said saturation pulse, and thereby causing said saturation pulse to act on said edge region in order to saturate an MR signal produced by nuclear spins in the examination object originating from said edge region, activating spoiler gradient fields that destroy a transverse magnetization of said nuclear spins at said edge region, and radiating a radio frequency (RF) excitation pulse that is adjusted to the SPAIR pulse, wherein the first predetermined frequency range is set to correspond to a first frequency range of an MR signal originating from fat and set to extend, dependent on homogeneities in said basic magnetic field, from a lower boundary of the first frequency range of said MR signal originating from fat, to a second frequency range at which a first amplitude of said MR signal originating from fat has a predetermined ratio second amplitude of another MR signal originating from water;
  generate said control signals and to operate said MR data acquisition scanner in order to acquire MR data from said examination object after radiating said SPAIR pulse, said saturation pulse and said RF excitation pulse, with the second predetermined frequency range adjusted to the first predetermined frequency range; and
  enter the acquired MR data into a memory and to make the MR data in said memory accessible, via said computer, in electronic form as a data file.

7. A non-transitory, computer-readable data storage medium encoded with programming instructions, said computer-readable data storage medium being loaded into a computer of a magnetic resonance (MR) apparatus comprising an MR data acquisition scanner that generates a basic magnetic field in an imaging volume within the MR data acquisition scanner, said imaging volume having an edge region in which a magnitude of the basic magnetic field differs from another magnitude of the basic magnetic field in the imaging volume by no more than 30 parts per million (ppm), said programming instructions causing said computer to generate control signals in order to operate said MR data acquisition scanner to:
  generate said control signals in said computer and provide said control signals from said computer to said MR data acquisition scanner in order to operate the MR data acquisition scanner by:
    radiating a Spectrally Adiabatic Inversion Recovery (SPAIR) pulse that acts on nuclear spins in an examination object in a first predetermined frequency range, wherein the first predetermined frequency range is set to correspond to a first frequency range of an MR signal originating from fat and set to extend, dependent on homogeneities in said basic magnetic field, from a lower boundary of the first frequency range of said MR signal originating from fat, to a second frequency range at which a first amplitude of said MR signal originating from fat has a predetermined ratio to a second amplitude of another MR signal originating from water;

radiating a saturation pulse which acts on nuclear spins in the examination object in a second predetermined frequency range;

activating a spatially encoding magnetic field gradient at a same time as said saturation pulse, and thereby causing said saturation pulse to act on said edge region in order to saturate an MR signal produced by nuclear spins in the examination object originating from said edge region;

activating spoiler gradient fields that destroy a transverse magnetization of said nuclear spins at said edge region; and radiating a radio frequency (RF) excitation pulse that is adjusted to the SPAIR pulse;

operate the MR data acquisition scanner in order to acquire MR data from said examination object after radiating said SPAIR pulse, said saturation pulse and said RF excitation pulse, with the second predetermined frequency range adjusted to the first predetermined frequency range; and enter the acquired MR data into a memory and make the MR data in said memory accessible, via said computer, in electronic form as a data file.

* * * * *